(12) United States Patent
Little

(10) Patent No.: US 8,677,932 B2
(45) Date of Patent: Mar. 25, 2014

(54) APPARATUS FOR METERING GRANULAR SOURCE MATERIAL IN A THIN FILM VAPOR DEPOSITION APPARATUS

(75) Inventor: Edwin Jackson Little, Denver, CO (US)

(73) Assignee: First Solar, Inc., Tempe, AZ (US)

( * ) Notice: Subject to any disclaimer, the term of this patent is extended or adjusted under 35 U.S.C. 154(b) by 186 days.

(21) Appl. No.: 13/197,233

(22) Filed: Aug. 3, 2011

(65) Prior Publication Data
US 2012/0048192 A1 Mar. 1, 2012

(51) Int. Cl.
*C23C 16/00* (2006.01)

(52) U.S. Cl.
USPC ........... 118/663; 118/719; 118/726; 118/727; 118/303; 118/308; 222/226; 222/251

(58) Field of Classification Search
USPC ......... 118/726–727, 719, 303, 308–312, 663; 222/220–226, 217, 271–272; 406/122–131, 128–129
See application file for complete search history.

(56) References Cited

U.S. PATENT DOCUMENTS

| | | |
|---|---|---|
| 5,248,349 A | 9/1993 | Foote et al. |
| 5,304,499 A | 4/1994 | Bonnet et al. |
| 5,366,764 A | 11/1994 | Sunthankar |
| 5,372,646 A | 12/1994 | Foote et al. |
| 5,712,187 A | 1/1998 | Li et al. |
| 5,820,678 A | 10/1998 | Hubert et al. |
| 5,994,642 A | 11/1999 | Higuchi et al. |
| 6,037,241 A | 3/2000 | Powell et al. |
| 6,058,740 A | 5/2000 | McMaster et al. |
| 6,423,565 B1 | 7/2002 | Barth et al. |
| 6,444,043 B1 | 9/2002 | Gegenwart et al. |
| 6,719,848 B2 | 4/2004 | Faykosh et al. |
| 7,194,197 B1 | 3/2007 | Wendt et al. |
| 2002/0117199 A1 | 8/2002 | Oswald |
| 2003/0044539 A1 | 3/2003 | Oswald |
| 2007/0007109 A1 | 1/2007 | Powell et al. |
| 2009/0001101 A1 | 1/2009 | Zahradka |
| 2009/0061090 A1* | 3/2009 | Negishi .......................... 118/729 |

(Continued)

FOREIGN PATENT DOCUMENTS

EP 0853345 A1 7/1998

OTHER PUBLICATIONS

Search Report and Written Opinion from corresponding EP Application No. 12178814.5-1215, dated Jan. 30, 2013.

(Continued)

*Primary Examiner* — Dah-Wei Yuan
*Assistant Examiner* — Binu Thomas
(74) *Attorney, Agent, or Firm* — MacMillan, Sobanski & Todd, LLC

(57) ABSTRACT

A metering mechanism is configured for transferring measured doses of a granular material from a first location to a second location, and is particularly suited for metering source material in a vapor deposition apparatus. A receiver is disposed to receive the granular material from the first location. A discharge port is axially offset from an outlet of the receiver. A reciprocating delivery member having a passage defined therethrough is moved in a reciprocating path by a controllable drive device between a load position wherein the passage is aligned with the receiver outlet and a discharge position wherein the passage is aligned with the discharge port. The amount of granular material transferred from the first location to the second location is a function of the volume of the passage and the reciprocating rate of the delivery member.

8 Claims, 4 Drawing Sheets

(56) References Cited

U.S. PATENT DOCUMENTS

| | | |
|---|---|---|
| 2009/0194165 A1 | 8/2009 | Murphy et al. |
| 2009/0288600 A1* | 11/2009 | Lee et al. ............... 118/715 |
| 2010/0304010 A1* | 12/2010 | Powell .................. 118/693 |
| 2011/0165326 A1* | 7/2011 | Little et al. ............. 118/729 |
| 2012/0052202 A1 | 3/2012 | Little |

OTHER PUBLICATIONS www.shake-it.com/e-z-weigh-sys.html; Jan. 7, 2010 Weigh-Systems Feeder/Hooper is a prior art system.

Related U.S. Appl. No. 12/683,831, filed Jan. 7, 2010.

Related U.S. Appl. No. 13/197,251, filed Aug. 3, 2011.

* cited by examiner

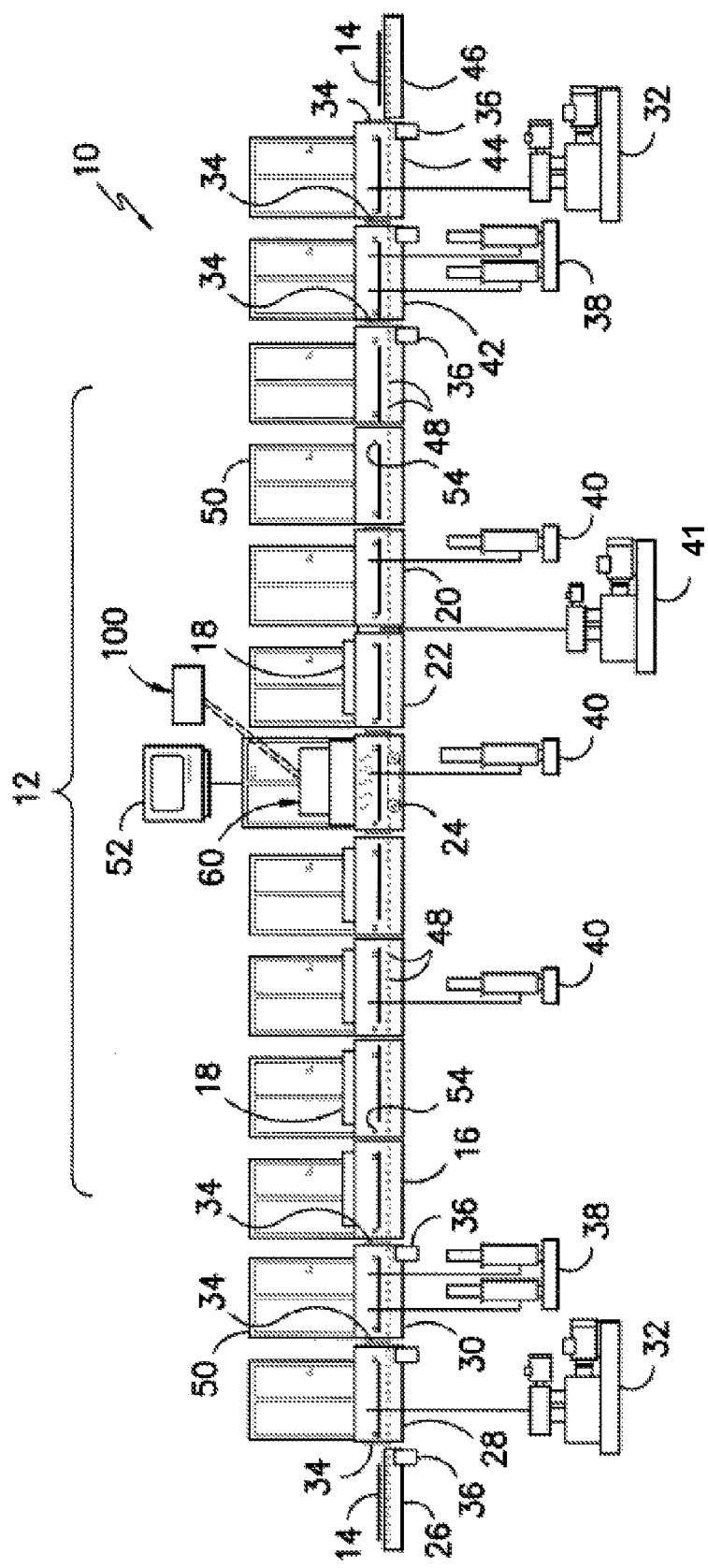
FIG. -1-

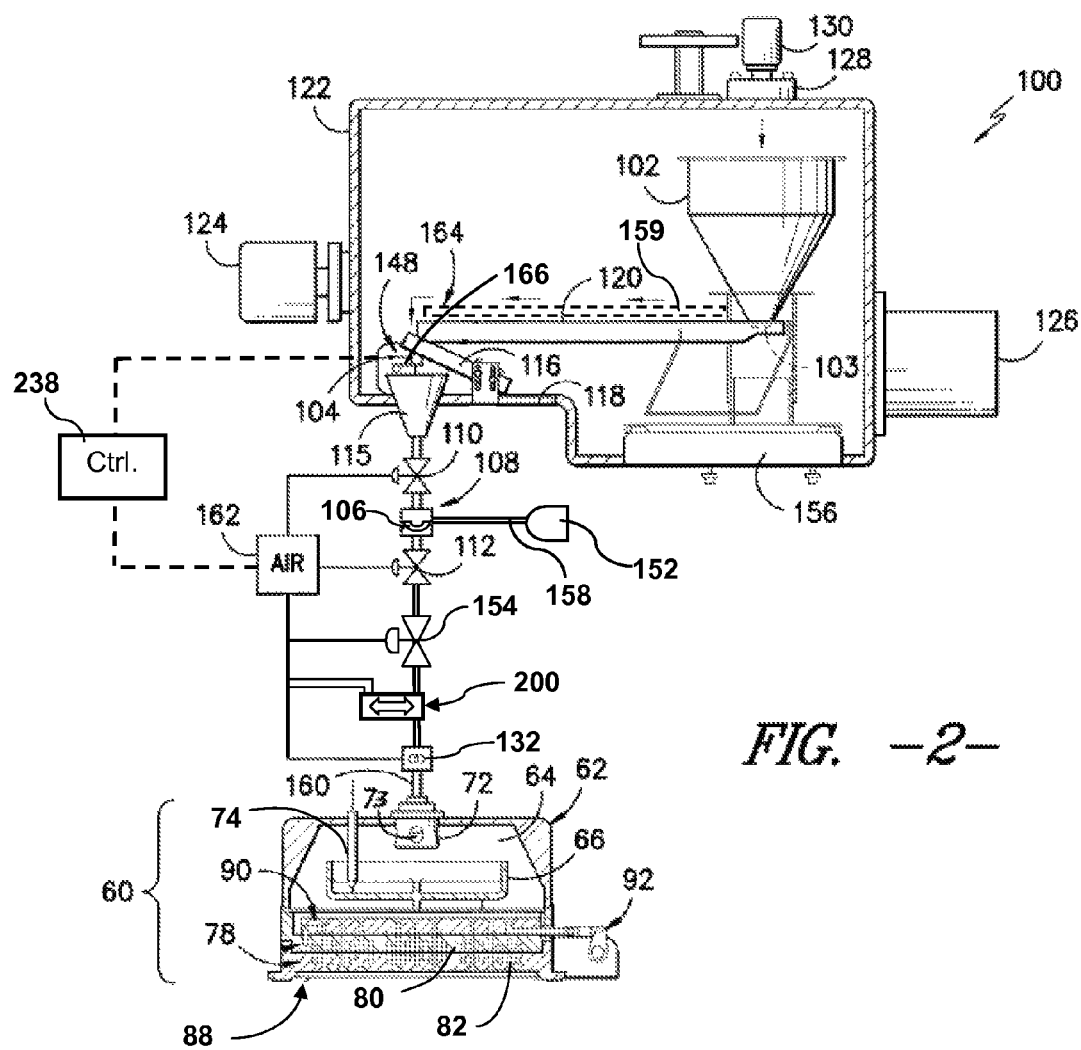
FIG. -2-

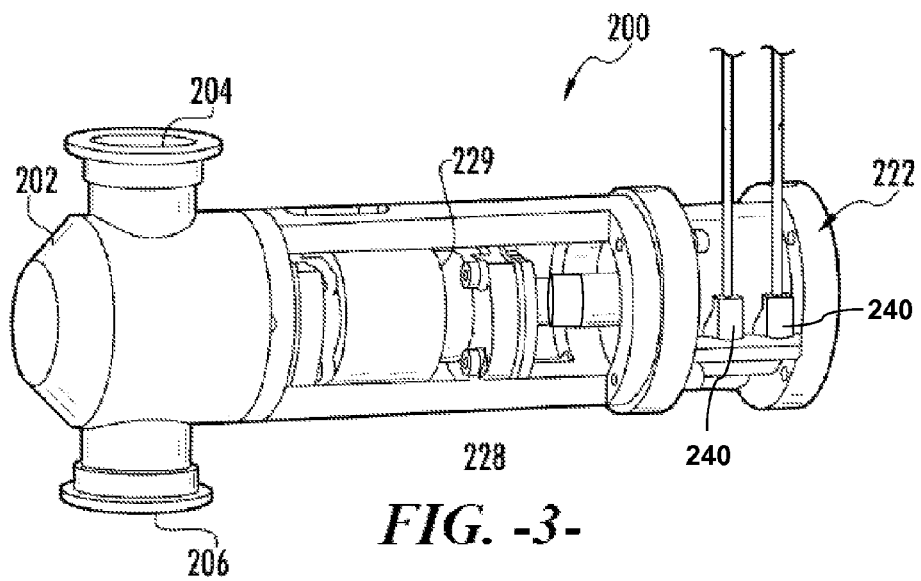
FIG. -3-
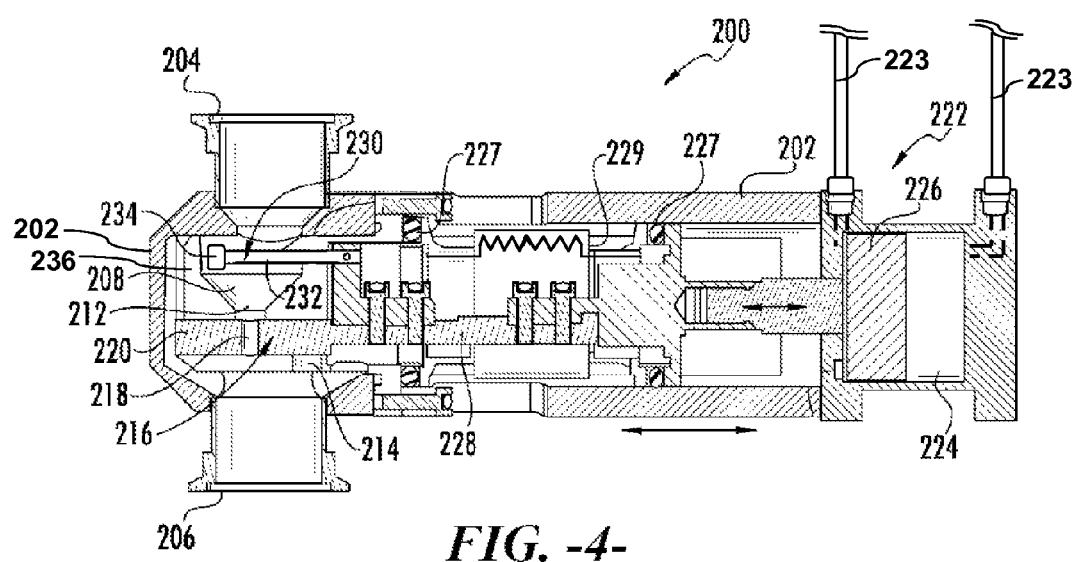
FIG. -4-

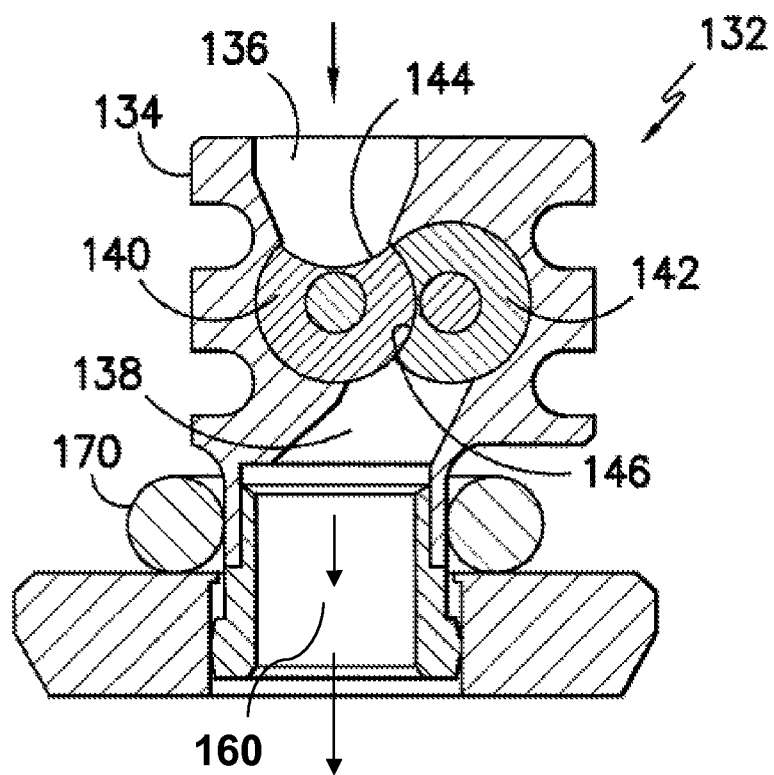
*FIG. -5-*

APPARATUS FOR METERING GRANULAR SOURCE MATERIAL IN A THIN FILM VAPOR DEPOSITION APPARATUS

FIELD OF THE INVENTION

The present invention relates generally to the field of thin film deposition systems wherein a thin film layer, such as a semiconductor layer, is deposited on a substrate conveyed through the system. More particularly, the invention is related to a metering device in a feed system configured to automatically introduce granular source material into a vapor deposition apparatus without disruption of the vacuum process.

BACKGROUND OF THE INVENTION

Thin film photovoltaic (PV) modules (also referred to as "solar panels") based on cadmium telluride (CdTe) paired with cadmium sulfide (CdS) as the photo-reactive components are gaining wide acceptance and interest in the industry. CdTe is a semiconductor material having characteristics particularly suited for conversion of sunlight (solar energy) to electricity. Solar energy systems using CdTe PV modules are generally recognized as the most cost efficient of the commercially available systems in terms of cost per watt of power generated. However, the advantages of CdTe not withstanding, sustainable commercial exploitation and acceptance of solar power as a supplemental or primary source of industrial or residential power depends on the ability to produce efficient PV modules on a large scale and in a cost effective manner.

Certain factors greatly affect the efficiency of CdTe PV modules in terms of cost and power generation capacity of the modules. For example, CdTe is relatively expensive and, thus, efficient utilization (i.e., minimal waste) of the material is a primary cost factor. In addition, the ability to process relatively large substrates on an economically sensible commercial scale is a crucial consideration.

An inherent problem of feeding granular CdTe material into a heated vapor deposition head under vacuum is that dose irregularities can result in non-uniformities in the subsequently formed thin film layer on the glass substrate. For example, dose quantities that are too large may cause the sublimation and resultant diffusion of the CdTe vapors onto the substrate to fluctuate to such an extent that film irregularities are produced.

Accordingly, there exists an ongoing need in the industry for improvement in the apparatus and method for feeding granular source material to a vapor deposition apparatus in the large-scale production of PV modules, particularly CdTe modules. The present invention relates to a feed system and that serves this purpose.

BRIEF DESCRIPTION OF THE INVENTION

Aspects and advantages of the invention will be set forth in part in the following description, or may be obvious from the description, or may be learned through practice of the invention.

In accordance with aspects of the invention, an embodiment of a feed system is provided for continuously feeding measured doses of source material to a deposition head in a vapor deposition apparatus wherein the source material is sublimated and deposited as a thin film on a substrate, such as a photovoltaic (PV) module substrate. A "thin" film is generally recognized in the art as less than 10 microns (μm) in thickness. The feed system includes a refillable bulk material hopper, and an upper dose receptacle disposed to receive source material from the hopper and transfer the source material into a vacuum lock chamber. A transfer mechanism is disposed downstream of the vacuum lock chamber and is configured to transfer the source material to a downstream deposition head while isolating the deposition conditions within the deposition head and blocking upstream diffusion of sublimated source material to the feed system. A metering mechanism is operatively disposed between the vacuum lock chamber and the transfer mechanism and includes a receiver disposed to receive source material from the lower dose receptacle, with the receiver having an outlet. A stationary discharge port in the metering mechanism is axially offset from the receiver outlet. A reciprocating delivery member having a passage defined therethrough is disposed below the receiver and a controllable drive device is configured to move the delivery member in a reciprocating path between a load position wherein the passage is aligned with the receiver outlet and a discharge position wherein the passage is aligned with the discharge port. In this manner, the amount of source material transferred from the lower dose receptacles to the transfer mechanism via the metering mechanism is a function of the volume of the passage and the reciprocating rate of the delivery member.

In a particular embodiment, the receiver is a funnel and the delivery member is a plate or other shaped member that moves in the reciprocating path below the outlet of the funnel.

Any suitable drive mechanism may be configured with the delivery member. In a particular embodiment, the drive mechanism is a pneumatic piston/cylinder configuration.

A stroke limiter may be operatively configured on the delivery member at a location to detect an overfill condition of the receiver and slightly restrict full stroke of the delivery member until the overfill condition is cleared, with the restricted stroke still discharging a full amount of the source material from the passage. In a particular embodiment, the stroke limiter is a mechanical probe/senor disposed at a location above the receiver so as to engage overflow source material in the receiver and thus restrict the full stroke of the delivery member until the source material recedes below the upper lip of the receiver.

In still further embodiments, the metering mechanism may include a stroke sensor that detects when the delivery member has cycled in a full stroke. The stroke sensor may be configured with the drive member. For example, the sensor may be a limit switch located to detect full range movement of an air piston in a pneumatic delivery member. A controller may be in communication with the stroke sensor and the lower dose receptacle, wherein upon receipt of a defined number of full stroke signals from the stroke sensor, the controller sends a control signal to the dose receptacle to deliver a measured dose of source material to the receiver.

Within the feed system, a lower dose receptacle may be disposed in the vacuum lock chamber, which may defined by sequentially operable vacuum lock valves. The metering mechanism and transfer mechanism are located downstream of the vacuum lock chamber. The downstream transfer mechanism may, in a particular embodiment, include a body having an inlet and an outlet, and a first cylinder aligned with the inlet and a second cylinder aligned with the outlet. The first and second cylinders have scalloped recesses defined therein and are sequentially rotatable such that source material from the inlet is received by the first cylinder recess and transferred to the second cylinder recess with rotation of the first cylinder. The second cylinder is subsequently rotatable to deliver the source material in the second cylinder recess to the outlet. The recesses are rotationally offset such that the cylinders block diffusion of sublimated source material between the outlet and inlet in all rotatable positions of the cylinders.

The present invention also encompasses a stand-alone metering mechanism configured for transferring measured doses of a granular material from a first location to a second location. This metering mechanism may have utility in any application or processing line wherein it is desired to transfer metered doses of a source material, and is not limited to application in a vapor deposition system. The metering mechanism includes a receiver with an outlet disposed to receive granular material from the first location. A discharge port is axially offset from the receiver outlet. A reciprocating delivery member having a passage defined therethrough is driven by a controllable drive device (e.g. a pneumatic drive) in a reciprocating fashion between a load position wherein the passage is aligned with the receiver outlet and a discharge position wherein the passage is aligned with the discharge port. With this configuration, the amount of granular material transferred from the first location to the second location is a function of the volume of the passage and the reciprocating rate of the delivery member.

The metering mechanism may include any of the features discussed above, including the stroke limiter and full stroke sensor configured with a controller.

The present invention also encompasses a vapor deposition apparatus for vacuum deposition of a sublimated source material as a thin film on a substrate conveyed through the apparatus. The apparatus includes a deposition head defining a deposition chamber in which source material supplied thereto is sublimated, and a conveyor assembly operably disposed below the deposition head to convey a substrate through the apparatus while a thin film of the sublimated source material is deposited onto an upper surface of the substrate. A feed system is provided for metering the source material to the deposition head. The feed system may be in accordance with the embodiments discussed above and described in greater detail below.

Variations and modifications to the embodiment of the feed system, metering mechanism, and vapor deposition apparatus discussed above are within the scope and spirit of the invention and may be further described herein.

These and other features, aspects and advantages of the present invention will become better understood with reference to the following description and appended claims.

BRIEF DESCRIPTION OF THE DRAWING

A full and enabling disclosure of the present invention, including the best mode thereof, is set forth in the specification, which makes reference to the appended drawings, in which:

FIG. 1 is a plan view of a system that may incorporate embodiments of a vapor deposition apparatus incorporating a source material feed system in accordance with aspects of the present invention;

FIG. 2 is a partial cross-sectional view of a particular embodiment of a source material feed system;

FIG. 3 is an external perspective view of an embodiment of a metering mechanism;

FIG. 4 is a cross-sectional view of an embodiment of a metering mechanism; and,

FIG. 5 is a cross-sectional view of an embodiment of a transfer mechanism.

DETAILED DESCRIPTION OF THE INVENTION

Reference now will be made in detail to embodiments of the invention, one or more examples of which are illustrated in the drawings. Each example is provided by way of explanation of the invention, not limitation of the invention. In fact, it will be apparent to those skilled in the art that various modifications and variations can be made in the present invention without departing from the scope or spirit of the invention. For instance, features illustrated or described as part of one embodiment, can be used with another embodiment to yield a still further embodiment. Thus, it is intended that the present invention encompass such modifications and variations as come within the scope of the appended claims and their equivalents.

Aspects of the present invention are related to the subject matter of co-pending U.S. patent application Ser. No. 12/683,831 filed on Jan. 7, 2010, which is incorporated herein by reference for all purposes.

FIG. 1 illustrates an embodiment of a vapor deposition system 10 that may incorporate a source material feed system 100 in accordance with aspects of the invention, particularly as a component of a vapor deposition apparatus or module 60. The system 10 is configured for deposition of a thin film layer on a photovoltaic (PV) module substrate 14 (referred to hereafter as "substrate"). The thin film may be, for example, a film layer of cadmium telluride (CdTe), cadmium sulfide (CdS), other semiconductor material, or other process materials requiring precision volumetric metering. As mentioned, it is generally recognized in the art that a "thin" film layer on a PV module substrate is generally less than about 10 microns ($\mu$m). It should be appreciated that the present feed system 100 is not limited to use in the system 10 illustrated in FIG. 1, but may be incorporated into any suitable processing line configured for vapor deposition of a thin film layer onto a PV module substrate 14 or other substrate.

For reference and an understanding of an environment in which the present source material feed system 100 may be used, the system 10 of FIG. 1 is described below, followed by a detailed description of the feed system 100.

Referring to FIG. 1, the exemplary system 10 includes a vacuum chamber 12 defined by a plurality of interconnected modules, including heater modules 16 (with controlled heaters 18) that define a pre-heat section through which the substrates 14 are conveyed and heated to a desired temperature before being conveyed into the vapor deposition apparatus 60. A plurality of interconnected cool-down modules 20 downstream of the vapor deposition apparatus 60 define a cool-down section within the vacuum chamber 12 in which the substrates 14 having the thin film of sublimed source material deposited thereon are allowed to cool at a controlled cool-down rate prior to being removed from the system 10.

In the illustrated embodiment of system 10, at least one post-heat module 22 is located immediately downstream of the vapor deposition apparatus 60 and before the cool-down modules 20 to maintain the temperature of the substrate 14 at essentially the same temperature as the remaining portion of the substrate 14 within the vapor deposition apparatus 60 as the substrate is conveyed out of the apparatus 60.

Still referring to FIG. 1, the individual substrates 14 are initially placed onto a load conveyor 26, and are subsequently moved into an entry vacuum lock station that includes a load module 28 and a buffer module 30. A "rough" (i.e., initial) vacuum pump 32, "fine" (i.e., final) vacuum pump 38, and valves 34 (with actuating mechanisms 36) are configured with the modules to move the substrates 14 from the load conveyor 26, through the load module 28 and buffer module 30, and into the vacuum chamber 12 without affecting the vacuum within the chamber 12. High vacuum pumps 40 and process pump 41 maintain the vacuum conditions in the vacuum chamber 12.

An exit vacuum lock station is configured downstream of the last cool-down module 20, and operates essentially in reverse of the entry vacuum lock station described above. For example, the exit vacuum lock station may include an exit buffer module 42, a downstream exit lock module 44, sequentially operated valves 34, and an exit conveyor 46 that operate in conjunction with a fine vacuum pump 38 and a rough vacuum pump 32 to move the substrates 14 out of the vacuum chamber 12 to atmospheric pressure outside of the system 10 in a step-wise fashion without loss of vacuum condition within the vacuum chamber 12.

System 10 also includes a conveyor system configured to move the substrates 14 into, through, and out of the vacuum chamber 12. In the illustrated embodiment, this conveyor system includes a plurality of individually controlled conveyors 48, with each of the various modules including one of the conveyors 48.

The vapor deposition apparatus 60 may include a dedicated conveyor system 24 that is specifically designed to convey the substrates through the apparatus 60 for efficient deposition of the sublimated source material onto a surface of the substrates 14.

As described, each of the various modules and respective conveyors in the system 10 are independently controlled to perform a particular function. For such control, each of the individual modules may have an associated independent controller 50 configured therewith to control the individual functions of the respective modules. The plurality of controllers 50 may, in turn, be in communication with a central system controller 52, as illustrated in FIG. 1. The central system controller 52 can monitor and control (via the independent controllers 50) the functions of any one of the modules so as to achieve an overall desired heat-up rate, deposition rate, cool-down rate, substrate conveyance speed, and so forth, in processing of the substrates 14 through the system 10.

Referring to FIG. 1, for independent control of the individual respective conveyors 48, each of the modules may include any manner of active or passive sensors 54 that detect the presence of the substrates 14 as they are conveyed through the module. The sensors 54 are in communication with the respective module controller 50, which is in turn in communication with the central controller 52. In this manner, the individual respective conveyors 48 may be controlled to ensure that a proper spacing between the substrates 14 is maintained and that the substrates 14 are conveyed at the desired constant or variable conveyance rates into, through, and out of the vacuum chamber 12.

The vapor deposition apparatus 60 may take on various configurations and operating principles within the scope and spirit of the invention, and is generally configured for vapor deposition of a sublimated source material, such as CdTe, as a thin film on the PV module substrates 14. In the embodiment of the system 10 illustrated in FIG. 1, the apparatus 60 is a module that includes a casing in which the internal components are contained, including a vacuum deposition head 62 (FIG. 2) mounted above the conveyor assembly 24.

Referring to FIG. 2, the deposition head 62 defines an interior vacuum deposition chamber 64 in which a receptacle 66 is configured for receipt of a granular source material (not shown) from the feed system 100 via a feed tube connected to a distributor 72 (with discharge ports 73) disposed in an opening in a top wall of the deposition head 62. A thermocouple 74 is operationally disposed through the top wall of the deposition head 62 to monitor temperature within the head chamber adjacent or in the receptacle 66.

A heated distribution manifold 78 is disposed below the receptacle 66, and may have a clamshell configuration that includes an upper shell member 80 and a lower shell member 82. The mated shell members 80, 82 define cavities in which heater elements are disposed that heat the distribution manifold 78 to a degree sufficient for indirectly heating the source material within the receptacle 66 to cause sublimation of the source material (along with additional heater elements that may surround the deposition head 62). The heated distribution manifold 78 includes a plurality of passages defined there through that serve to uniformly distribute the sublimated source material towards the underlying substrates 14. A distribution plate 88 is disposed below the manifold 78 at a defined distance above a horizontal plane of the upper surface of an underlying substrate 14, and includes a pattern of holes or passages therethrough that further distribute the sublimated source material passing through the distribution manifold 78 in a manner to ensure further uniformity in distribution of the sublimated source material. Additionally, the distribution plate 88 receives heat from the distribution manifold 78 to a degree sufficient to prevent condensation and buildup of source material on the distribution plate 88, thus preventing blockage of the passages through the plate 88.

Still referring to FIG. 2, a movable shutter plate 90 disposed above the distribution manifold 78. This shutter plate 90 includes a plurality of passages defined there through that align with the passages in the distribution manifold 78 in a first operational position of the shutter plate 90 such that the sublimated source material is free to flow through the shutter plate 90 and through the distribution manifold 78 for subsequent distribution through the plate 88. The shutter plate 90 is movable to a second operational position wherein the passages are misaligned with the passages in the distribution manifold 78. In this configuration, the sublimated source material is blocked from passing through the distribution manifold 78, and is essentially contained within the interior volume of the deposition head 62. Any suitable actuation mechanism 92 may be configured for moving the shutter plate 90 between the first and second operational positions.

As diagrammatically illustrated in FIG. 1, the feed system 100 is configured with the vapor deposition apparatus 60 to supply source material, such as granular CdTe. The feed system 100 supplies the source material without interrupting the continuous vapor deposition process within the apparatus 60 or conveyance of the substrates 14 through the apparatus 60. To obtain consistent thickness and quality of the thin film layer deposited onto the substrates 14, it is desired to continuously feed and maintain a set level of material within the deposition head 62.

Referring to FIG. 2, in the illustrated embodiment, the feed system 100 includes a bulk material hopper 102 that has a size and shape for receipt of the source material in solid form, such as granular, pellet, or powder form. As discussed above, the source material may, for example, be CdTe, which is eventually sublimated in the chamber 64 of the deposition head 62 and deposited as a thin film layer on an underlying substrate 14 (FIG. 1). In the illustrated embodiment, the hopper 102 has a generally truncated or funnel-shape with an enlarged inlet that receives the source material from an external supply 130, such as a canister or drum, which mates to a fill port 128. The hopper 102 tapers to an outlet 103.

The source material from the hopper 102 is deposited into a transport mechanism 164 that conveys the source material to an upper dose receptacle 104, which may be a cup-shaped member. In the illustrated embodiment, the transport mechanism 164 includes a vibration chute 120 that vibrates at a predetermined frequency in order to reliably and consistently move the granular source material along the length of the chute 120. In a typical operation, the vibration would be activated for specified time intervals, with pauses between the intervals. The time intervals would be set as needed to match the fill capacity of a downstream dose cup 104, as described below. A radiant heater 159 may be disposed above the vibration chute 120 and may be used to "bake out" the granular source material as it moves along the vibration chute 120. This process serves to expel any excess moisture from the source material so as to minimize any detrimental effects such moisture may have on the ultimate deposition process.

The vibration chute 120 conveys the source material to a location above the upper dose receptacle 104. The dose receptacle 104 may, for example, be defined as an open-ended cylinder in the upper portion of an overflow chute 116. The receptacle 104 has an internal volume such that, when the receptacle 104 is full, a precisely measured dose of the source material is contained within the receptacle 104. The dose receptacle 104 may be configured to be adjustable in volume in the event that different overall dose sizes are needed. The overflow chute 116 is desirable as an extra protection against overdosing and causing malfunctions of downstream components of the feed system 100. A catch tray 118 is configured to collect material from the overflow chute 116.

A release mechanism 148 is configured with the upper dose receptacle 104 to release the source material from the receptacle 104 once the receptacle has been adequately filled with the source material. The release mechanism 148 may take on various configurations and, in the illustrated embodiment, includes a hinge plate or trap door 166 that is mounted onto a rotatable rod. The plate 166 is biased against the open-end (bottom) of the upper dose receptacle 104 and, once the receptacle 104 is filled with the source material, the plate 166 rotates to release the source material from the receptacle 104 and into a funnel 115 or other suitably shaped receiver. The plate 166 may be driven by a motor or other actuating mechanism at the appropriate time and interval to ensure that the measured doses of source material are continuously and cyclically conveyed (dropped) into the funnel 115 in a manner to synchronize with the point in the feed sequence when an upper vacuum lock valve 110 is open, as described below.

Referring again to FIG. 2, an enclosure 122 defines a controlled space around the hopper 102 and various other components of the feed system 100. The enclosure 122 is formed by any suitable structure that defines an essentially sealed environment around the components. Suction is maintained in the internal volume of the enclosure 122 via a vent suction 126 that draws air into the enclosure 122 through an inlet filter 124. This ventilation air flow through the enclosure 122 ensures that any source material dust or other particulates are captured and filtered by an external ventilation system so as not to present an environmental or health concern in the work environment.

Referring still to FIG. 2, it may be desired to include a weigh scale 156 configured with the hopper 102 for various control functions. For example, the weigh scale 156 may be used to control the amount of source material supplied into the hopper 102 from the external source 130, particularly since the hopper 102 is not visible from outside of the enclosure 122. The weigh scale 156 may also be used to calculate average dose weight and keep track of the ongoing source material consumption within the deposition system.

A lower dose receptacle ("cup") 106 is disposed downstream of the upper dose cup 104 in a vacuum lock chamber 108. The lower dose cup 106 receives the measured dose of source material from the upper dose cup 104, and eventually transfers the measured dose of material downstream in a manner so as not to interrupt the vacuum or deposition process within the deposition head 62. The upper dose cup 104 is designed to be smaller than the lower dose cup 106 to ensure that the lower dose cup 106 is not overfilled, which could cause failure of the downstream vacuum lock valves due to contamination of the valves by source material particles. In the embodiment illustrated in FIG. 2, the vacuum lock chamber 108 is defined between an upstream vacuum lock valve 110 and a downstream vacuum lock valve 112. The embodiment of FIG. 2 also includes a maintenance valve 154 downstream from the vacuum lock valve 112. The maintenance valve 154 may be used during continued vacuum operation of the deposition head 62 to isolate vacuum lock valve 112 and all portions of the upstream feed system 100 for periodic cleaning without the need to vent deposition head 62 to atmosphere and interrupt the deposition coating process. These vacuum lock valves 110, 112, and maintenance valve 154 may be conventional gate-style vacuum valves actuated by, for example, an external air supply 162, motor drive, or other suitable actuating member.

In operation, the upper vacuum lock valve 110 is initially open, the lower vacuum lock valve 112 is closed, and maintenance valve 154 remains open. The measured dose of source material from the upper dose cup 104 travels through the funnel receiver 115, through the upper vacuum lock valve 110, and into the lower dose cup 106. At this point, the upper vacuum lock valve 110 closes and a vacuum is drawn in the chamber or space between the valves 110, 112 by any suitable combination of vacuum pump or pumps 152 that draw through a vacuum port 158 configured with the chamber 108. For example, the vacuum pump configuration 152 may include an initial or "rough" pump that draws an initial vacuum in the chamber 108, and a "fine" or "high-vacuum" pump that draws a final vacuum in the chamber 108 that essentially matches the vacuum within the downstream deposition head 62. Any suitable vacuum pump configuration may be utilized in this regard. The valves 110, 112 are configured as double seal gate valves in a particular embodiment.

When a vacuum pressure has been equalized between the vacuum lock chamber 108 and the downstream deposition head 62, the lower vacuum lock valve 112 opens and the lower dose cup 106 rotates to dump the source material, which is conveyed by gravity to a downstream metering mechanism 200 (described in greater detail below). After a short time delay, the lower dose cup 106 rotates to its upright position and the lower vacuum lock valve 112 closes. The vacuum lock chamber 108 is then vented and once the chamber is at atmospheric pressure, the upper vacuum lock valve 110 opens and the cycle repeats for another dose of the source material from the upper dose cup 104.

In the embodiment illustrated in FIG. 2 wherein vacuum lock valve 112 is utilized (with valves 110, 112, and 154 being double seal gate valves), it is desirable to utilize vacuum pumping between the opposing two seals of the gate valves 110, 112, and 154 when they are closed to provide an additional reliability to enable continued operation in the event that incidental source material particles cause leaking by one or both of the gate valve seats. This is commonly referred to as "differential pumping."

As depicted in more detail in FIGS. 3 and 4, the metering mechanism 200 is disposed downstream of the lower dose cup 106 to receive the measured dose of source material and eventually transfers the source material at a controlled discharge rate to a downstream transfer mechanism 132.

FIGS. 3 and 4 depict an embodiment of the metering mechanism 200. In this embodiment, the mechanism 200 includes a housing 202 that defines an inlet 204 for receipt of source material from the upstream upper dose receptacle 104, and an outlet 206 through which the source material is discharged at a controlled rate to the downstream transfer mechanism 132.

The metering mechanism 200 includes a receiver 208 which, in the illustrated embodiment, is a funnel-shaped member having an outlet 212. The receiver 208 is disposed to receive the source material from the inlet 204.

The metering mechanism 200 includes a reciprocating delivery member 216 that is disposed below the receiver 208. In the illustrated embodiment, the reciprocating delivery member 216 is defined by a shaft, plate, or other shaped member 220 having a passage 218 defined therein. The passage 218 has a specific volume for receipt of a defined amount of source material from the receiver 208 in a load position of the shaft 220 depicted in FIG. 4.

A discharge port 214 is stationarily defined within the housing 202 and is axially offset from the outlet 212 of the receiver 208. The discharge port 214 is in communication with the outlet 206.

A controllable drive device 222 is configured with the metering mechanism 200 to move the delivery member 216 in a reciprocating back-and-forth path as depicted by the arrows in FIG. 4. Thus, referring to FIG. 4, in the load position of the delivery member 216, the passage 218 receives a charge of the source material from the receiver 208. The delivery member 216 is subsequently driven to the right by the drive device 222 until the passage 218 aligns with the discharge port 214 in a full stroke of the delivery member 216. In this discharge position, the source material within the passage 218 drops through the discharge port 214 and out through the outlet 206 to the downstream transfer mechanism 132.

It should be appreciated that any manner of suitable drive mechanism 222 may be configured to provide the reciprocating drive for the delivery member 216. In the illustrated embodiment, the drive device 222 is a pneumatic device wherein a piston 226 is driven in a reciprocating path within a cylinder 224. Air lines 223 are provided on opposite sides of the piston 226 to drive the piston in either direction. In other embodiments, the drive device 222 may be an electric motor, a hydraulic system, an electro-mechanical system, and the like, and that the pneumatic drive depicted in the figures and described herein is for illustrative purposes only.

Referring again to FIG. 4, it should be appreciated that any manner of linkage 228 may be configured between the drive end of the piston 226 and the shaft 220, as generally depicted in the figure. Various O-ring seals 227 may also be provided to accommodate the reciprocating motion of the linkage within the housing 202. A vacuum bellows 229 may also be provided around the components within the housing 202 to help ensure that vacuum is maintained in the operating end of the device wherein the source material is conveyed.

In a unique embodiment depicted in the figures, the metering mechanism 200 may include a stroke limiter 230 that serves to prevent a full stroke of the shaft 220 if an overfill condition is detected within the receiver 208. This stroke limiter 230 may be any suitable sensory device, such as an optical detector, or other suitable electronic detector. In the embodiment illustrated in the figures, the stroke limiter 230 is a mechanical device that includes an arm 232 having a sensor nose 234 at one end thereof. The arm 232 is linked by any suitable mechanical connection to the linkage that drives the delivery member 216 so as to move in conjunction with the delivery member 216. The arm 232 and nose 234 are disposed slightly above the top of the receiver 208. If an overfill condition of the source material is generated within the receiver 208, then the source material will extend above the upper lip of the receiver and will be engaged by the nose 234 as the arm 232 moves in the reciprocating path. The source material will become "jammed" between the nose 234 and either one of the walls 236 of the housing 202 that extend above the upper lip of the receive 208 and, thus, will prevent a full stroke of the delivery member 216 until the overflow source material is cleared by falling down into the receiver 208. In this manner, a full stroke of the shaft 220 is prevented, although the passage 218 will still fully align within the receiver outlet 212 so that a full transfer of the source material into the passage 218 is still accomplished. After a number of strokes, the overflow source material is reduced and the delivery member 216 will again travel full stroke.

Referring still to FIG. 4, the partial strokes of the delivery member 216 may be detected by any manner of stroke sensor 240 that is configured with the controllable drive 222. For example, in the embodiment wherein the drive 222 is a pneumatically driven piston 226, limit switches may be provided as the stroke sensors 240, which may be triggered by a magnetic ring in piston 226. These sensors are positioned so that partial strokes of the delivery member 216 caused by an overflow condition of the source material will not be detected, but full strokes will be detected.

Referring to FIG. 2, a controller 238 may be provided in communication with the stroke sensor 240, as well as the upper dose receptacle 104 and lower dose receptacle 106. The controller may be configured such that, upon receipt of a defined number of full stroke signals from the stroke sensor 240, the controller 238 will send a control signal to the lower dose receptacle 106 to deliver the next measured dose of source material into the receiver 208. Thus, dosing from the upper dose receptacle 106 is "on demand" and excess buildup of the source material above the metering mechanism 200 is prevented.

The controller 238 may also be in control communication with the air source 162, gate valves 110, 112, and the transfer mechanism 132 for the coordinated and sequential control of the components as described herein. The controller 238 may also be a component of the overall system controller 52 (FIG. 1) or configured in communication with the system controller 52.

It should be appreciated that the present invention also encompasses a stand-alone metering mechanism 200 as described herein that is configured for transferring measured doses of a granular material from a first location to a second location. In other words in certain embodiments, the metering mechanism is not limited for use as a component of a feed system in a vapor deposition apparatus and may have utility in any system wherein it is desired to meter measured doses of a granular material.

It should also be appreciated that, in further aspects of the invention, a vapor deposition apparatus as described, for example, in FIG. 1, may include a feed system that utilizes a metering mechanism 200 as described herein.

The transfer mechanism 132 is disposed below the metering mechanism to receive the measured dose of source material from the metering mechanism 200. The transfer mechanism 132 is configured to transfer the source material to the downstream deposition head 62 without disrupting the vacuum or deposition process within the deposition head 62. A particular embodiment of the transfer mechanism 132 depicted in FIG. 5 is a pneumatically actuated device that is supplied with actuating air via any suitably configured air system 162 (FIG. 2). The mechanism 132 includes a body 134 that defines an inlet 136 aligned for receipt of the measured dose of source material from the metering mechanism 200. The body 134 defines an outlet 138 that is aligned with fill port structure in the top wall of the deposition head 62. As discussed above, the source material is introduced into the deposition head 62 and distributed by distribution member 72 into the receptacle 66.

Referring still to FIG. 5, the transfer mechanism 132 includes a first rotatable cylinder 140 and a second rotatable cylinder 142 configured within the body 134. The first rotatable cylinder 140 includes a scalloped recess 144 defined in a circumferential portion thereof. Likewise, the second rotatable cylinder 142 includes a scalloped recess 146 defined in a circumferential portion thereof. FIG. 5 illustrates an initial starting position of the respective cylinders 140, 142 wherein the recess 144 in the first cylinder 140 faces upward and receives the source material conveyed through the downstream valve 112 and metering mechanism 200. The recess 146 in the second cylinder 142 is at the nine o'clock position against the outer circumference of the first cylinder 140. In operation, the first cylinder 140 rotates clockwise within the recess 146 until the recess 144 in the first cylinder 140 is aligned opposite with the recess 146 in the second cylinder 142. The first cylinder 140 is maintained in this position with its respective recess 144 at the three o'clock position as the second cylinder 142 is rotated counter-clockwise within the recess 144 until its respective recess 146 is at the six o'clock position. It should be readily appreciated that the second cylinder 142 rotates into the recess 144 of the first cylinder 140 as it rotates to the six o'clock. Thus, the source material is transferred from the first cylinder 140 to the second cylinder 146. When the recess 146 in the second cylinder 142 reaches the six o'clock position, the source material is conveyed by gravity to the outlet 138 in the body 134. The cylinders 140 and 142 then reset by reverse sequence to their respective starting positions illustrated in FIG. 3.

The relatively small clearances between the rotating cylinders 140, 142 and the body 134, as well as within the respective recesses 144, 146, ensure that, during operation, the moving surfaces of the transfer mechanism 132 are essentially self cleaning. It should also be appreciated that the sequential operation of the cylinders 140, 142 prevents any sublimated source material from the deposition head 62 from traveling freely upstream past the transfer mechanism 132, where any such gasses would plate-out over time and potentially clog or otherwise hinder operation of the feed system 100.

It should be appreciated that the sequencing of the transfer mechanism 132 is totally independent of the dosing sequence as performed by valve 112. Also, it should be noted that on a short term basis, the transfer mechanism 132 may operate with excess material stacked within and above inlet 136. This can be a normal operating state of the mechanism. However, to prevent long term accumulated stacking of material above the inlet 136, which could ultimately cause jamming of the feed system, the throughput of the upstream metering mechanism 200 should be controlled as discussed above to limit excess buildup of the source material in the transfer mechanism 132.

It may be desired to maintain the bottom portion of the transfer mechanism 132 at a relatively high temperature, for example greater than 600° C., to prevent any condensation and build up of source material from the deposition head 62 in, around, or below the outlet 138. For this purpose, a heater 170 may be configured around the bottom portion of the body 134.

It should be appreciated that operation of the cylinders 140, 142 may be by any suitable actuating mechanism. In a particular embodiment, rotation of the cylinders may be accomplished by crank arms and push rods that are powered by an external air system 162, which may include air cylinders associated with each respective cylinder 140, 142. In an alternate embodiment, the cylinders 140, 142 may be actuated in a single direction rotary fashion by one or more motor drives using coordinated and sequenced intermittent motion while still providing the necessary self-cleaning functions previously discussed. Another embodiment could utilize cylinders 140, 142 having multiple scalloped recesses along with the intermittent motor drive. Yet a further embodiment could utilize single direction continuous rotary motion, whereby the external shapes of the two cylinders 140, 142 are appropriately designed to provide the small clearances needed for sublimated gas blocking and self-cleaning functions.

While the present subject matter has been described in detail with respect to specific exemplary embodiments and methods thereof, it will be appreciated that those skilled in the art, upon attaining an understanding of the foregoing may readily produce alterations to, variations of, and equivalents to such embodiments. Accordingly, the scope of the present disclosure is by way of example rather than by way of limitation, and the subject disclosure does not preclude inclusion of such modifications, variations and/or additions to the present subject matter as would be readily apparent to one of ordinary skill in the art.

What is claimed is:

1. A feed system for continuously feeding measured doses of source material to a vapor deposition apparatus, said feed system comprising:
    a bulk material hopper;
    an upper dose receptacle disposed to receive source material from said hopper;
    a transfer mechanism disposed downstream of said upper dose receptacle, said transfer mechanism configured to transfer the source material to a downstream deposition head while isolating the deposition conditions within the deposition head and blocking upstream diffusion of sublimated source from said vapor deposition apparatus to said feed system;
    a metering mechanism operatively disposed upstream of said transfer mechanism and positioned between said upper dose receptacle and said transfer mechanism, said metering mechanism further comprising:
        a receiver disposed to receive source material supplied from said upper dose receptacle, said receiver having an outlet;
        a discharge port axially offset from said receiver outlet;
        a reciprocating delivery member having a passage defined therethrough, wherein the passage defines a volume;
        a controllable drive device configured to move said reciprocating delivery member in a reciprocating path between a load position wherein said passage is aligned with and below said receiver outlet and a discharge position wherein said passage is aligned with and above said discharge port, wherein the controllable drive device is configured to move said reciprocating delivery member in the reciprocating path at a reciprocating rate; and
        a stroke limiter disposed on said delivery member at a location to detect an overfill condition of said receiver;
    wherein the amount of source material transferred from said upper dose receptacle to said transfer mechanism is a function of the volume of said passage and the reciprocating rate of said delivery member in said metering mechanism.

2. The feed system as in claim 1, wherein said receiver comprises a funnel and said delivery member comprises a movable member in the reciprocating path below said funnel.

3. The feed system as in claim 1, wherein said drive device comprises a pneumatic drive with a motive air piston.

4. The feed system as in claim 1, wherein said stroke limiter comprises a mechanical sensor disposed at a location above said receiver that engages overflow source material from said receiver.

5. The feed system as in claim 4, further comprising a full stroke sensor that detects a full stroke of said delivery member, and a controller in communication with said full stroke sensor and said dose receptacle, wherein upon receipt of a defined number of full stroke signals from said full stroke sensor, said controller sends a control signal to said dose receptacle to deliver a measured dose of source material to said receiver.

6. The feed system as in claim 1, further comprising a lower dose receptacle disposed in a vacuum lock chamber downstream of said upper dose receptacle, said vacuum lock chamber defined by sequentially operable vacuum lock valves, said metering mechanism configured for receipt of the source material from said lower dose receptacle.

7. The feed system as in claim 6, further comprising an actuatable maintenance valve disposed upstream of said metering mechanism for isolating said vacuum lock chamber from said metering mechanism during periodic maintenance procedures.

8. A feed system for continuously feeding measured doses of source material to a vapor deposition apparatus, said feed system comprising:

a bulk material hopper;

an upper dose receptacle disposed to receive source material from said hopper;

a transfer mechanism disposed downstream of said upper dose receptacle, said transfer mechanism configured to transfer the source material to a downstream deposition head while isolating the deposition conditions within the deposition head and blocking upstream diffusion of sublimated source from said vapor deposition apparatus to said feed system;

a metering mechanism operatively disposed upstream of said transfer mechanism and positioned between said upper dose receptacle and said transfer mechanism, said metering mechanism further comprising:

a receiver disposed to receive source material supplied from said upper dose receptacle, said receiver having an outlet;

a discharge port axially offset from said receiver outlet;

a reciprocating delivery member having a passage defined therethrough, wherein the passage defines a volume; and, a controllable drive device configured to move said reciprocating delivery member in a reciprocating path between a load position wherein said passage is aligned with and below said receiver outlet and a discharge position wherein said passage is aligned with and above said discharge port, wherein the controllable drive device is configured to move said reciprocating delivery member in the reciprocating path at a reciprocating rate; and wherein the amount of source material transferred from said upper dose receptacle to said transfer mechanism is a function of the volume of said passage and the reciprocating rate of said delivery member in said metering mechanism;

wherein said transfer mechanism further comprises a body having an inlet and an outlet, and a first cylinder aligned with said inlet and a second cylinder aligned with said outlet, said first and second cylinders having scalloped recesses defined therein, and said first and second cylinders being sequentially rotatable such that source material from said inlet is received by said first cylinder recess and transferred to said second cylinder recess with rotation of said first cylinder, said second cylinder subsequently rotatable to deliver the source material in said second cylinder recess to said outlet, said recesses rotationally offset such that said cylinders block diffusion of sublimated source material between said outlet and inlet in all rotatable positions of said cylinders.

* * * * *